US012369494B2

(12) United States Patent
Chen et al.

(10) Patent No.: US 12,369,494 B2
(45) Date of Patent: Jul. 22, 2025

(54) MRAM TOP ELECTRODE STRUCTURE WITH LINER LAYER

(71) Applicant: INTERNATIONAL BUSINESS MACHINES CORPORATION, Armonk, NY (US)

(72) Inventors: Hsueh-Chung Chen, Cohoes, NY (US); Koichi Motoyama, Clifton Park, NY (US); Chanro Park, Clifton Park, NY (US); Yann Mignot, Slingerlands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 17/932,691

(22) Filed: Sep. 16, 2022

(65) Prior Publication Data

US 2024/0099148 A1 Mar. 21, 2024

(51) Int. Cl.
| | | |
|---|---|---|
| *H10N 50/01* | (2023.01) | |
| *G11C 11/16* | (2006.01) | |
| *H10B 61/00* | (2023.01) | |
| *H10N 50/10* | (2023.01) | |
| *H10N 50/80* | (2023.01) | |

(52) U.S. Cl.
CPC .......... *H10N 50/01* (2023.02); *G11C 11/161* (2013.01); *H10B 61/00* (2023.02); *H10N 50/10* (2023.02); *H10N 50/80* (2023.02)

(58) Field of Classification Search
CPC ...... G11C 11/161; H10N 50/01; H10N 50/80; H10N 50/10; H10N 52/85; H10B 61/00
See application file for complete search history.

(56) References Cited

U.S. PATENT DOCUMENTS

| | | | |
|---|---|---|---|
| 8,980,649 | B2 | 3/2015 | Ranjan |
| 9,786,839 | B2 | 10/2017 | Bhushan |
| 9,865,649 | B2 | 1/2018 | Tan |
| 10,056,544 | B2 | 8/2018 | Mudivarthi |
| 10,096,768 | B2 | 10/2018 | Jiang |
| 10,121,964 | B2 | 11/2018 | Tan |
| 10,199,572 | B2 | 2/2019 | Yi |
| 10,424,727 | B2 | 9/2019 | Gaidis |
| 10,461,247 | B2 | 10/2019 | Shum |
| 10,535,814 | B2 | 1/2020 | Chuang |
| 10,608,046 | B2 | 3/2020 | Yi |
| 11,005,032 | B2 | 5/2021 | Chuang |
| 2016/0005959 | A1 | 1/2016 | Li |
| 2017/0222128 | A1* | 8/2017 | Sung ............ H10D 64/00 |
| 2020/0266338 | A1* | 8/2020 | Peng ............ H10N 50/10 |

(Continued)

FOREIGN PATENT DOCUMENTS

WO 2019005082 A1 1/2019

*Primary Examiner* — Uyen Smet
(74) *Attorney, Agent, or Firm* — Jeffrey Ingalls (57) ABSTRACT

A semiconductor device is provided. The semiconductor device includes a memory including a bottom electrode, a magnetic tunnel junction (MTJ) stack on the bottom electrode, and an upper electrode on the MTJ stack. The semiconductor device also includes at least one dielectric layer formed around the memory, wherein a top metal layer contact hole is formed in the at least one dielectric layer, a dielectric liner layer formed in the top metal contact hole, and a top metal layer contact in the top metal layer contact hole.

19 Claims, 5 Drawing Sheets

(56) References Cited

U.S. PATENT DOCUMENTS

| | | | |
|---|---|---|---|
| 2021/0217811 A1* | 7/2021 | Min | H10N 50/80 |
| 2021/0359197 A1 | 11/2021 | Frougier | |
| 2022/0352457 A1* | 11/2022 | Chuang | H10N 50/80 |
| 2023/0263069 A1* | 8/2023 | Yang | H10N 50/80 |
| | | | 257/421 |

* cited by examiner

MRAM TOP ELECTRODE STRUCTURE WITH LINER LAYER

BACKGROUND

The present disclosure relates to magnetic random access memory (MRAM) devices based on magnetic tunnel junction (MTJ) structures. Certain MRAM devices may be fabricated to include a bottom electrode, an MRAM stack, and a top electrode. In general, MRAM devices may be used in a variety of applications. One example application is embedded storage (e.g., eFlash replacement). Another example is cache (e.g., embedded dynamic random-access memory (eDRAM), or static random-access memory (SRAM)). Preventing electrical shorting among various layers of the memory device may be desirable.

SUMMARY

Embodiments of the present disclosure relate to a semiconductor device. The semiconductor device includes a memory including a bottom electrode, a magnetic tunnel junction (MTJ) stack on the bottom electrode, and an upper electrode on the MTJ stack. The semiconductor device also includes at least one dielectric layer formed around the memory, wherein a top metal layer contact hole is formed in the at least one dielectric layer, a dielectric liner layer formed in the top metal contact hole, and a top metal layer contact in the top metal layer contact hole.

Other embodiments relate to a method of manufacturing a semiconductor device. The method includes forming a memory by forming a bottom electrode, forming a magnetic tunnel junction (MTJ) stack on the bottom electrode, and forming an upper electrode on the MTJ stack. The method also includes forming at least one dielectric layer around the memory, forming a top metal layer contact hole in the at least one dielectric layer, forming a dielectric liner layer in the top metal contact hole, removing at least substantially horizontal portions of the dielectric liner layer, and forming a top metal layer contact in the top metal layer contact hole.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

The present disclosure describes MRAM devices including magnetic tunnel junction ("MTJ") stacks and methods of manufacturing MRAM devices. In particular, the present disclosure describes MRAM devices and methods of manufacturing same, the devices including a structure of a top electrode structure having a dielectric liner layer that prevents electrical shorting between the MTJ stack and the top metal contact.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of elements can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto a surface, such as the surface of a wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from a surface, such as the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties of a material by doping, for example, transistor sources and drains, generally by diffusion and/or by ion implantation. These doping processes may be followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) may be used to connect and isolate transistors and their components. Selective doping of various regions of the semiconductor substrate allows the conductivity of the substrate to be changed with the application of voltage. By creating structures of these various components, billions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed using a light sensitive polymer called a photoresist. To build the complex structures that make up a transistor and the many wires that connect the millions of transistors of a circuit, lithography and etch pattern transfer operations are repeated multiple times. Each pattern being formed on the wafer is aligned to the previously formed patterns and slowly the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (all) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years. Magnetoresistive random-access memory (MRAM) devices using magnetic tunnel junctions (MTJ) are one option to replace existing eDRAM technologies. MRAM is a non-volatile memory, and this benefit is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating oxide layer (i.e., a tunnel barrier layer) to form a stacked structure. The tunnel barrier layer may comprise, for example, magnesium oxide or aluminum oxide. One of the ferromagnetic layers has a magnetization that is fixed, and it is therefore referred to as a magnetic fixed layer (or pinned layer, or reference layer). However, the other ferromagnetic layer has a magnetization that can change, and it is therefore referred to as a free layer (or magnetic free layer). When a bias voltage is applied to the MTJ device, electrons that are spin polarized by the ferromagnetic layers traverse the insulating barrier through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The materials and geometries used to build the stack of different layers forming the MTJ device are factors that affect the characteristics of the device in terms of speed (i.e., switching time) and power consumption (e.g., voltage and/or current required to switch the device from one state to another). As discussed above, certain MTJ devices have a pillar structure (i.e., a stack of materials) having a cylindrical shape, where current flows from a top layer to a bottom layer, or vice versa, in order to switch the magnetization of one ferromagnetic layer. These types of MTJ devices are generally referred to as spin transfer torque (STT) MTJ devices. Certain STT MRAM devices may have limited switching speed and endurance in comparison to static random access memory (SRAM) devices (i.e., random access memory that retains data bits in its memory as long as power is being supplied). Other types of MTJ devices are referred to as spin orbit torque (SOT) devices. In the SOT type of device, the stacked pillar structure is still cylindrically shaped, but the stack is deposited on top of a heavy metal conductor. In the SOT type of MTJ device, current flows horizontally in this conductor and switches the magnetization of the ferromagnetic layer at the interface.

In STT type MRAM devices, the manufacture of the devices is often performed in conjunction with forming middle-of-line (MOL) or back-end-of-line (BEOL) layers. This may be referred to as embedded MRAM, where the MRAM devices are embedded in, or formed in conjunction with these layers. In general, front-end-of-line (FEOL) refers to the set of process steps that form transistors and other circuit elements (such as resistors and capacitors) that are later connected electrically with middle-of-line (MOL) and back-end-of-line (BEOL) layers. In general, MOL refers to the set of wafer processing steps used to create the structures that provide the local electrical connections between transistors (e.g., gate contact formation). MOL processing generally occurs after FEOL processes and before BEOL processes. In general, the BEOL is the portion of IC fabrication where the individual devices (transistors, capacitors, resistors, etc.) are interconnected with wiring on the wafer.

As discussed above, MRAM devices may be useful for a variety of different applications, such as embedded storage and cache. For high performance MRAM devices, electrical shorting may be possible at various locations in the device. In certain examples, a top metal layer contact hole may be formed to allow for connection to the top electrode of the semiconductor device. If the hole is inadvertently etched too deep, it may expose the sidewalls of one or more layers of the MTJ stack, thus leading to possible shorting when the top metal interconnect layer is later formed. However, as described in detail herein, some of the present embodiments provide a method and structure for forming a top electrode structure having a dielectric liner layer that separates (and electrically isolates) the top metal layer (or M2) from the MTJ stack.

Figure 1:
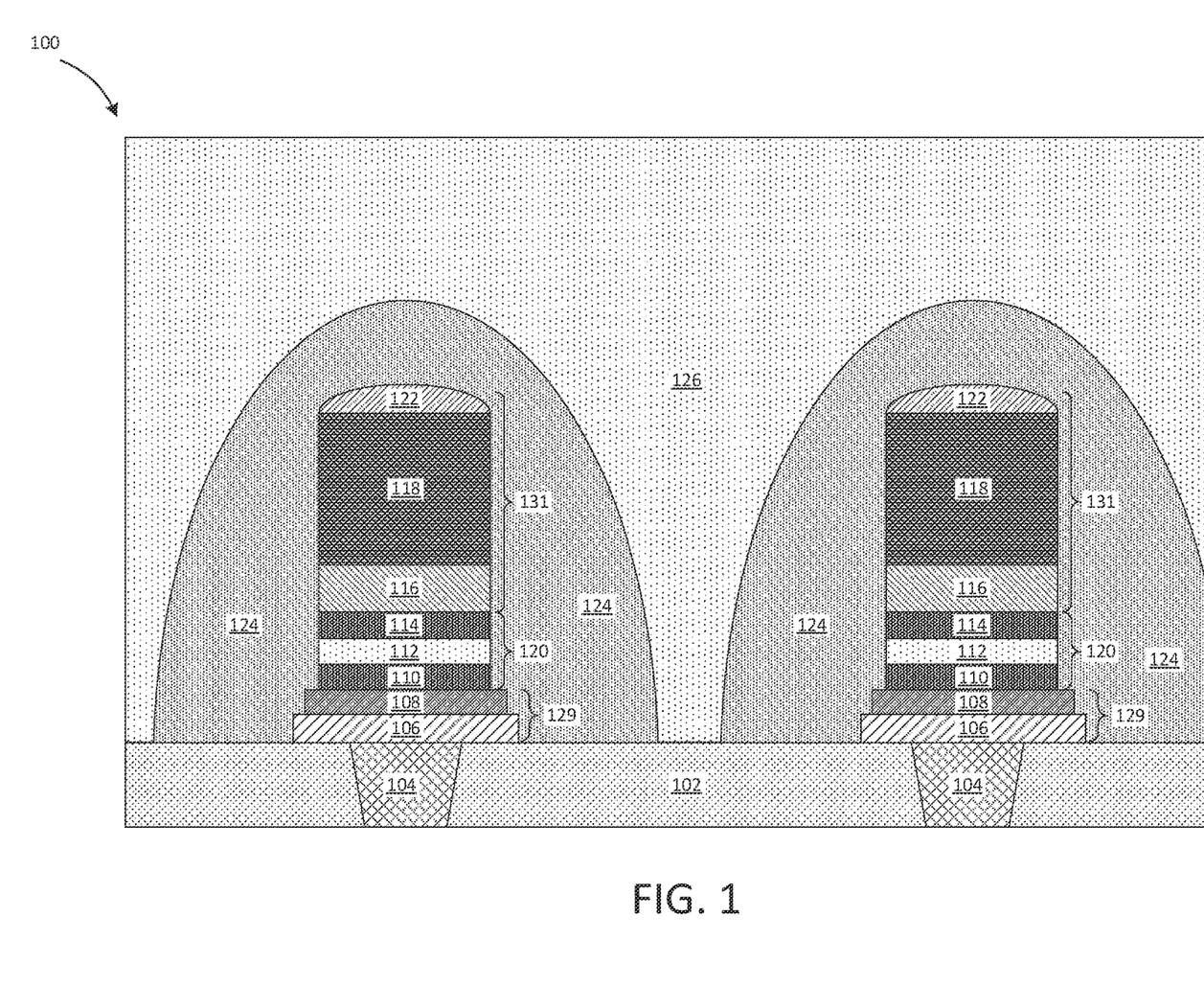
FIG. 1 is a cross-sectional view of a semiconductor device that includes an MRAM device at an intermediate stage of the manufacturing process, according to embodiments.

Referring now to the drawings in which like numerals represent the same or similar elements and initially to FIG. 1, an exemplary method of manufacturing a semiconductor device 100 (i.e., an MRAM device) to which the present embodiments may be applied is shown. In certain examples, several back end of line ("BEOL") layers and front end of line (FEOL) layers may be formed. The BEOL metal layers (not shown) can include, for example, Cu, TaN, Ta, Ti, TiN or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers may be a starting structure upon which the MRAM devices are formed.

As shown in the semiconductor device 100 of FIG. 1, an oxide layer 102 is provided as a base layer into which an interconnect structure of the semiconductor device 100 may be formed. The oxide layer 102 may include, for example, TEOS, low-κ or ultra low-κ (ULK) etc. In certain embodiments, a first metal layer 104 (or bottom metal layer) is provided in the oxide layer 102, and this first metal layer 104 may be included in one of the BEOL layers. In certain examples, the first metal layer 104 (or M1) may include, Cu, Co, Nb, NbN, W, WN, Ta, TaN, Ti, TiN, Ru, Mo, Cr, V, Pd, Pt, Rh, Sc, Al and other metals or conductive metal nitrides. It should be appreciated that the interconnect structure shown in FIG. 1 is merely one example, and any other suitable interconnect structure (e.g., number of layers, size, number of contact, etc.) may be used.

As shown in FIG. 1, a lower electrode 129 (or bottom electrode) is formed that includes a plurality of layers. In certain embodiments, the lower electrode 129 includes a first lower electrode layer 106 and a second lower electrode layer 108. One or more of the first lower electrode layer 106 and the second lower electrode layer 108 may comprise, for example, Nb, NbN, W, WN, Ta, TaN, Ti, TiN, Ru, Mo, Cr, V, Pd, Pt, Rh, Sc, Al and other high melting point metals or conductive metal nitrides, or any other suitable conductive material(s) for use in an electrode. It should be appreciated that this bi-layer lower electrode 129 is merely one example, and any suitable lower electrode (or bottom electrode) may be used. It should also be appreciated that the different layers of the lower electrode 129 may have the same or different material compositions.

As shown in FIG. 1, an MTJ stack 120 is formed on the lower electrode 129. The MTJ stack 120 may include multiple layers such as, for example, multiple magnetic layers separated by an insulating layer. In certain embodiments, the MTJ stack 120 includes a reference layer 110, a tunnel barrier layer 112, and a magnetic free layer 114. In general, the magnetic free layers have a magnetic moment or magnetization that can be flipped. In certain embodiments, the tunnel barrier layer is a barrier, such as a thin insulating layer or electric potential, between two electrically conducting materials. Electrons (or quasiparticles) pass through the tunnel barrier by the process of quantum tunneling. In certain embodiments, the tunnel barrier layer 112 includes at least one sublayer composed of MgO. The reference layer 110 (or fixed layer) may, for example, be annealed in a magnetic field to set a polarization state of the reference layer in the MTJ stack 120. In certain embodiments, each layer of the MTJ stack 120 may have a thickness less than an angstrom to a thickness of several angstroms or nanometers. Examples of typical materials in an MTJ stack can include MgO, $MgAlO_x$, $AlO_x$, etc. for the tunnel barrier layer, CoFeB for the free layer, and a plurality of layers comprised of different materials for the reference layer. It should be appreciated that the MRAM material stack (MTJ stack 120) is not limited to these materials, or the layers described above. That is, the MRAM material stack can be composed of any known stack of materials used in MRAM devices. In certain embodiments, the MTJ stack 120 can have a combination of ferro and anti-ferromagnetic metals such as Co/Fe/Ni, other metals such as Pt/Ir as well as B. Moreover, it should be appreciated that the MTJ stack 120 may include additional layers, omit certain layers, and each of the layers may include any number of sublayers. It should be appreciated that this MRAM stack 120 structure shown in FIG. 1 is only an example, and any other suitable MRAM stack structure known to one of skill in the art may be utilized.

As shown in FIG. 1, an upper electrode 131 (or top electrode) is formed on the MTJ stack 120, and the upper electrode 131 includes a plurality of layers, in certain embodiments. In certain embodiments, an upper electrode 131 includes a first upper electrode layer 116, a second upper electrode layer 118 and a third upper electrode layer 122. One or more of the first upper electrode layer 116, the second upper electrode layer 118 and the third upper electrode layer 122 may comprise, for example, Nb, NbN, W, WN, Ta, TaN, Ti, TiN, Ru, Mo, Cr, V, Pd, Pt, Rh, Sc, Al and other high melting point metals or conductive metal nitrides, or any other suitable conductive material(s) for use in an electrode. It should be appreciated that this tri-layer upper electrode 131 is merely one example, and any suitable upper electrode may be used. It should also be appreciated that the different layers of the upper electrode 131 may have the same or different material composition.

In certain embodiments, after the formation of the upper electrode 131, a hardmask (not shown) is formed on the upper electrode 131 to be used for subsequent patterning of the MTJ stack structure. In certain embodiments, the hardmask is a multilayer hardmask. At least initially, the hardmask is formed over the entire semiconductor device 100 as a continuous layer (as are the MTJ stack 120 layers and upper electrode 131 layers). In certain examples, the material of the hardmask may be TaN or any other suitable material(s). For example, the hardmask may include one or more of the following materials: TaN, WCN; TiN; TaAlN; WN; TEOS; low-κ and ULK etc. Then a lithographic mask (not shown) is formed that may be used to pattern the MRAM stack 120. In one example, the lithographic mask is a tri-layer mask including an organic planarizing layer, a lithographic hardmask (e.g., SiARC, SiN, SiON, etc.), and a photoresist. It should be appreciated that the lithographic hardmask may include a single layer or a plurality of layers. The photoresist may be formed by patterning using any suitable lithographic process. In one example, the pattern of the photoresist layer is transferred to the magnetic tunnel junction (MTJ) stack 120 (i.e., the reference layer 110, the tunnel barrier layer 112, and the magnetic free layer 114), which is etched to create the MTJ pillars. In one example, a two-step material removal process is used to form the MTJ pillars. In a first material removal step, RIE is used to remove the material down to the level of the top of the MTJ stack 120 (i.e., removing the material of the hardmask, the organic planarizing layer, and the lithographic hardmask). In a second material removal step, an IBE process is used to remove the material of the upper electrode 131, the MTJ stack 120 and the lower electrode 129. After the pattern of the photoresist has been transferred to the create the MTJ stack 120 pillars, the photoresist, the lithographic hardmask, the organic planarization layer and the hardmask are removed.

As also shown in FIG. 1, a dielectric encapsulation layer 124 is formed over the entire semiconductor device 100. The dielectric encapsulation layer 124 may include, for example, SiN or SiCN(H), or any other suitable dielectric material. One purpose of the dielectric encapsulation layer 124 is to isolate the tunnel barrier layer 112 of the MTJ stack 120 from the outside environment. Then, as shown in FIG. 1, a dielectric fill layer 126 is formed in and around the MTJ stack 120 pillars.

Figure 2:
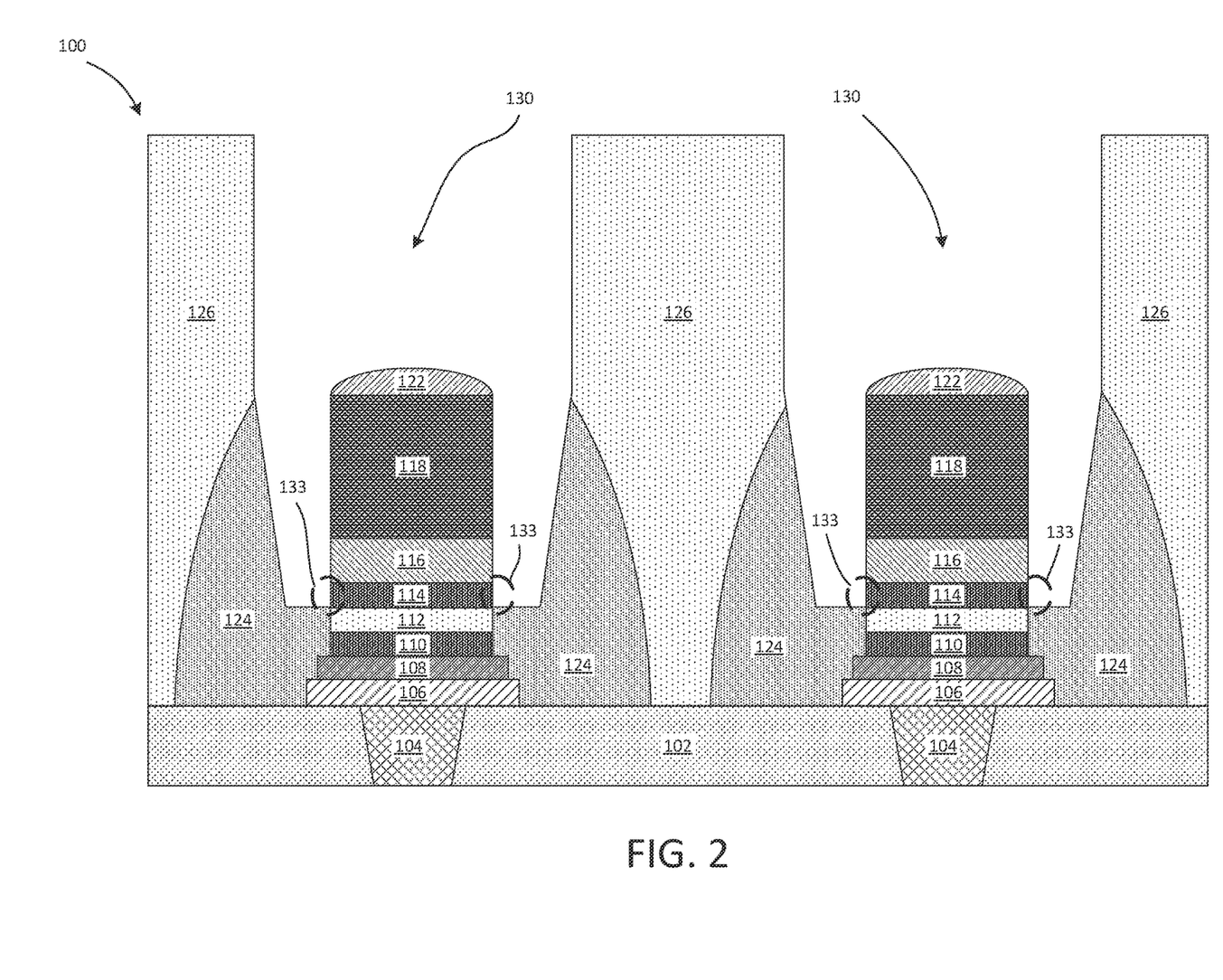
FIG. 2 is a cross-sectional view of the semiconductor device of FIG. 1 after additional fabrication operations, according to embodiments.

Referring now to FIG. 2, this figure is a cross-sectional view of the semiconductor device 100 of FIG. 1 after additional fabrication operations, according to embodiments. As shown in FIG. 2, a suitable material removal process is used to create an upper metal contact hole 130 (or trench). The upper metal contact hole 130 is formed deep enough through the dielectric fill layer 126 and the dielectric encapsulation layer 124 to expose a portion of the upper electrode 131 (see, FIG. 1). However, it may be possible in this material removal step that the depth of upper metal contact hole 130 is too deep, thus exposing a portion of the MTJ stack 120 (i.e., exposing a portion of the MTJ stack 120 that was previously protected by the dielectric encapsulation layer 124). In the example shown in FIG. 2, at least a portion of the sidewall of the magnetic free layer 114 (or possibly other layers of the MTJ stack 120 depending on how deep the etching goes) are exposed. Thus, if a top metal layer (or top metal contact) is formed in the upper metal contact hole 130 at this stage there may be a possibility of electrical shorting in areas 133, as shown in FIG. 2.

Figure 3:
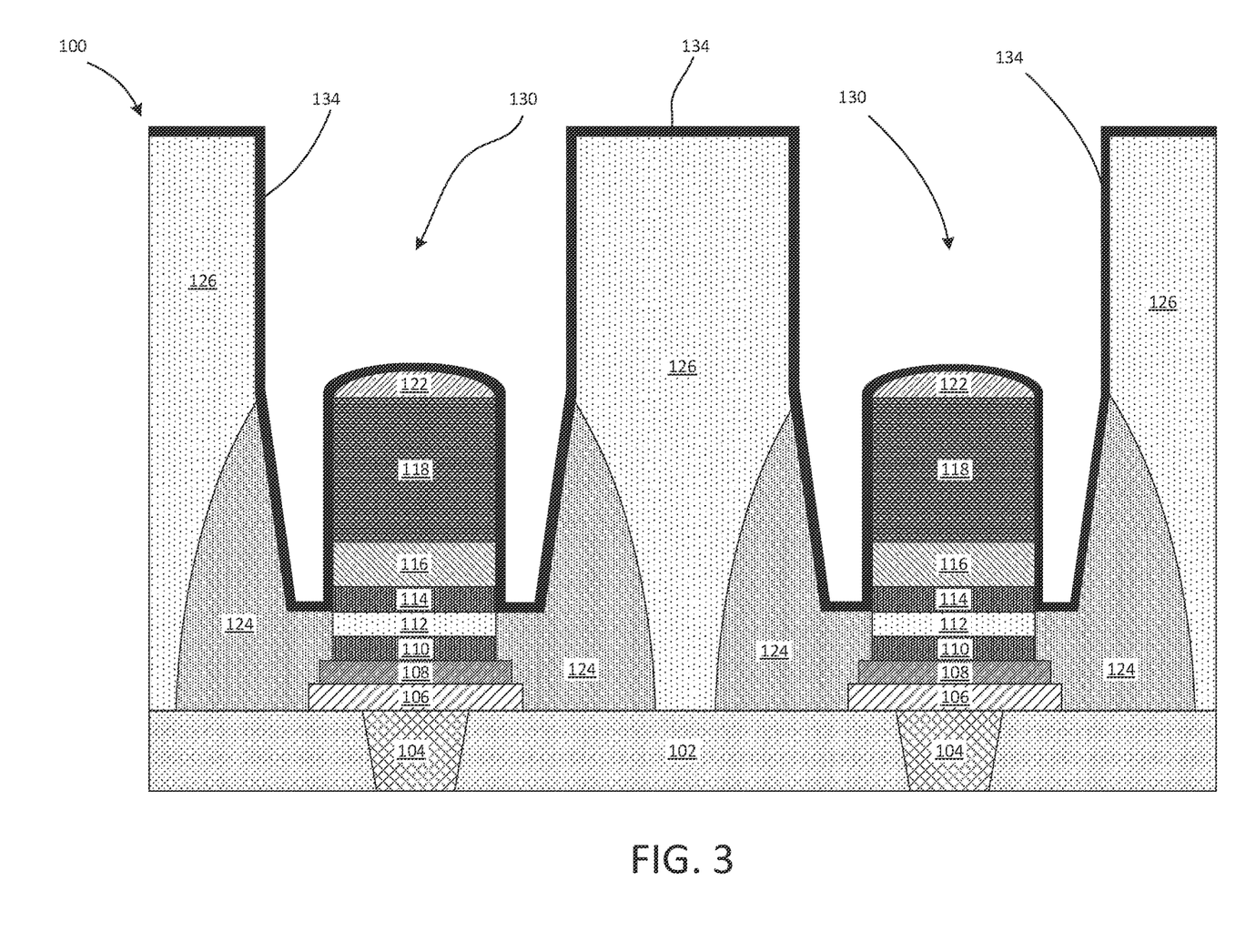
FIG. 3 is a cross-sectional view of the semiconductor device of FIG. 2 after additional fabrication operations, according to embodiments.

Referring now to FIG. 3, this figure is a cross-sectional view of the semiconductor device 100 of FIG. 2 after additional fabrication operations, according to embodiments. As shown in FIG. 3, in order to prevent possible electrical shorting, a dielectric liner layer 134 is conformally deposited over the entire surface of the semiconductor device 100. The dielectric liner layer 134 may be comprised of any suitable dielectric material(s) (e.g., AlN) known to one of skill in the art. Thus, this dielectric liner layer 134 covers the exposed sidewalls of one or more of the layers of the MTJ stack 120 in the areas 133 shown in FIG. 2. At this stage of the manufacturing process, the dielectric liner layer 134 also covers all of the surfaces of the upper electrode 131.

Figure 4:
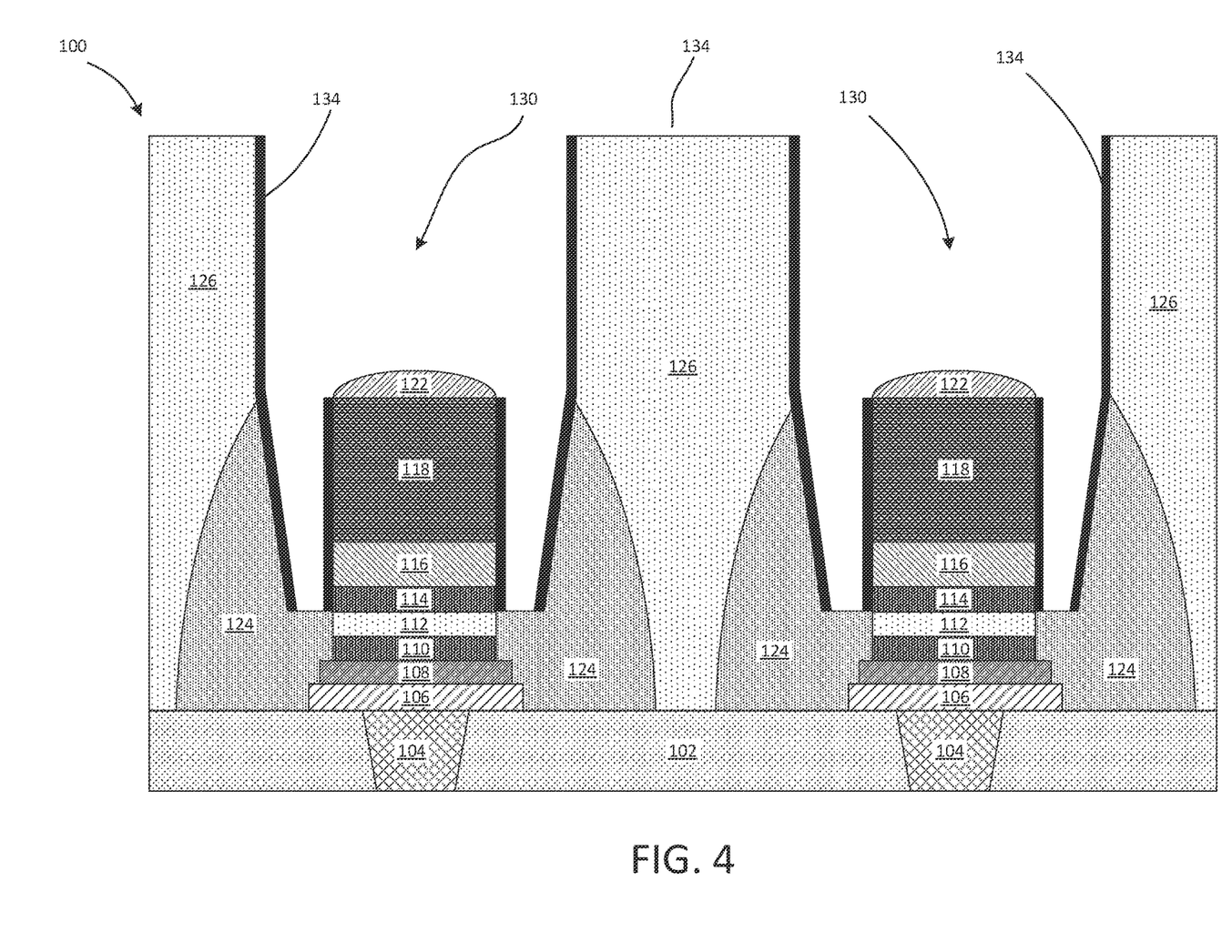
FIG. 4 is a cross-sectional view of the semiconductor device of FIG. 3 after additional fabrication operations, according to embodiments.

Referring now to FIG. 4, this figure is a cross-sectional view of the semiconductor device 100 of FIG. 3 after additional fabrication operations, according to embodiments. As shown in FIG. 4, an etchback process (or etching process) is used to remove non-vertical (or nearly non-vertical) portions of the dielectric liner layer 134. Thus, the portions of the dielectric liner layer 134 at the bottom of the upper metal contact hole 130 are removed, thereby exposing a portion of the dielectric encapsulation layer 124. Moreover, the horizontal (or nearly horizontal) portions of the dielectric liner layer 134 covering the upper electrode 131 and the dielectric fill layer 126 are removed. Accordingly, any previously exposed sidewall portions of the MTJ stack 120 (e.g., the magnetic free layer 114) are now covered with the dielectric encapsulation layer 134, which at the same time at least the third upper electrode layer 122 is exposed for electrical connection to a metal contact layer.

Figure 5:
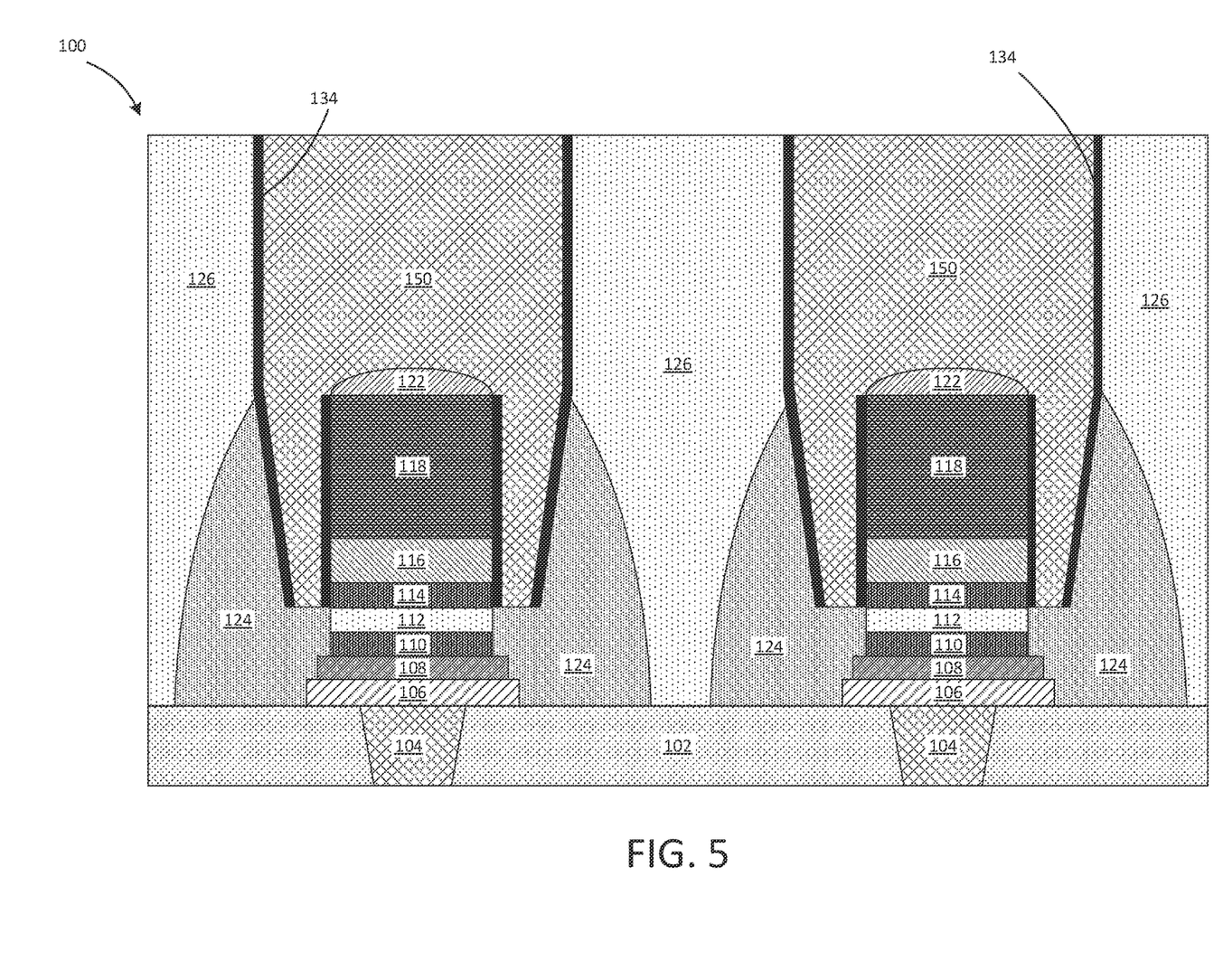
FIG. 5 is a cross-sectional view of the semiconductor device of FIG. 4 after additional fabrication operations, according to embodiments.

Referring now to FIG. 5, this figure is a cross-sectional view of the semiconductor device of FIG. 4 after additional fabrication operations, according to embodiments. As shown in FIG. 5, a metallization process is performed to form the top metal contact 150. The top metal contact 150 thus fills in the remaining open space in the upper metal contact hole 130. However, as mentioned above, the dielectric liner layer 134 acts as an insulating barrier between the top metal contact 150 and the various layers of the MTJ stack 120, thus preventing electrical shorts. It should be appreciated that the top metal contact 150 may be made of any suitable conductive material(s). In certain examples, a width of the top metal contact hole 130 is greater than a width of the upper electrode 131.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a semiconductor device, the method comprising:
   forming a memory by
      forming a bottom electrode,
      forming a magnetic tunnel junction (MTJ) stack on the bottom electrode, and
      forming an upper electrode on the MTJ stack;
   forming at least one dielectric layer around the memory;
   forming a top metal layer contact hole in the at least one dielectric layer, the top metal layer contact hole formed to a depth sufficient to expose at least a portion of a sidewall of the MTJ stack;
   after forming the top metal layer contact hole, forming a dielectric liner layer in the top metal contact hole;
   removing at least substantially horizontal portions of the dielectric liner layer; and
   forming a top metal layer contact in the top metal layer contact hole.

2. The method according to claim 1, wherein the dielectric liner layer covers at least a portion of a sidewall of the MTJ stack.

3. The method according to claim 1, wherein forming the at least one dielectric layer includes forming a dielectric encapsulation layer and a dielectric fill layer.

4. The method according to claim 1, wherein the MTJ stack includes a reference layer, a tunnel barrier layer, and a magnetic free layer.

5. The method according to claim 1, wherein the dielectric liner layer covers sidewalls of the upper electrode.

6. The method according to claim 1, wherein a width of the top metal contact hole is greater than a width of the upper electrode.

7. The method according to claim 1, wherein at least a portion of the dielectric liner layer is between the top metal contact and the MTJ stack.

8. The method according to claim 1, wherein the top metal contact is in direct contact with at least an upper surface of the upper electrode.

9. The method according to claim 1, wherein the dielectric liner layer comprises AlN.

10. A semiconductor device comprising:
   a memory including
      a bottom electrode,
      a magnetic tunnel junction (MTJ) stack on the bottom electrode, and
      an upper electrode on the MTJ stack;
   at least one dielectric layer formed around the memory, wherein a top metal layer contact hole is included in the at least one dielectric layer, the top metal layer contact hole extending to a depth to at least partially expose a sidewall of the MTJ stack;
   a dielectric liner layer formed in the top metal contact hole that covers at least the partially exposed sidewall of the MTJ stack; and
   a top metal layer contact in the top metal layer contact hole.

11. The semiconductor device according to claim 10, wherein the dielectric liner layer covers at least a portion of a sidewall of the MTJ stack.

12. The semiconductor device according to claim 10, wherein the top metal contact hole is formed to a depth sufficient to expose at least a portion of a sidewall of the MTJ stack.

13. The semiconductor device according to claim 10, wherein the at least one dielectric layer includes a dielectric encapsulation layer and a dielectric fill layer.

14. The semiconductor device according to claim 10, wherein the MTJ stack includes a reference layer, a tunnel barrier layer, and a magnetic free layer.

15. The semiconductor device according to claim 10, wherein the dielectric liner layer covers sidewalls of the upper electrode.

16. The semiconductor device according to claim 10, wherein a width of the top metal contact hole is greater than a width of the upper electrode.

17. The semiconductor device according to claim 10, wherein at least a portion of the dielectric liner layer is between the top metal contact and the MTJ stack.

18. The semiconductor device according to claim 10, wherein the top metal contact is in direct contact with at least an upper surface of the upper electrode.

19. The semiconductor device according to claim 10, wherein the dielectric liner layer comprises AlN.

* * * * *